United States Patent
D'Luna et al.

(10) Patent No.: US 7,333,390 B2
(45) Date of Patent: Feb. 19, 2008

(54) PHASE CONTROLLED HIGH SPEED INTERFACES

(75) Inventors: Lionel J. D'Luna, Irvine, CA (US); Mark Chambers, Mission Viejo, CA (US); Thomas Hughes, Dana Point, CA (US); Kwang Y. Kim, Irvine, CA (US); Sathish K. Radhakrishnan, Bangalore (IN)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 11/287,380

(22) Filed: Nov. 28, 2005

(65) Prior Publication Data
US 2006/0077752 A1 Apr. 13, 2006

Related U.S. Application Data

(63) Continuation of application No. 10/832,262, filed on Apr. 27, 2004, now Pat. No. 6,975,557.

(60) Provisional application No. 60/509,542, filed on Oct. 9, 2003, provisional application No. 60/507,525, filed on Oct. 2, 2003.

(51) Int. Cl.
*G11C 8/00* (2006.01)

(52) U.S. Cl. ............. 365/233; 327/236; 327/156; 327/160

(58) Field of Classification Search ........... 327/236, 327/156, 160; 365/233
See application file for complete search history.

(56) References Cited

U.S. PATENT DOCUMENTS

| | | | |
|---|---|---|---|
| 5,485,490 A | 1/1996 | Leung et al. | |
| 6,707,728 B2 | 3/2004 | Lee | |
| 6,822,924 B2 | 11/2004 | Lee | |
| 6,977,539 B1* | 12/2005 | McDonagh et al. | 327/295 |
| 2001/0025350 A1 | 9/2001 | Hohler et al. | |
| 2002/0131539 A1* | 9/2002 | Li et al. | 375/355 |
| 2003/0035502 A1 | 2/2003 | Boerker | |
| 2003/0155953 A1* | 8/2003 | Hirata et al. | 327/236 |
| 2004/0071227 A1* | 4/2004 | Lee | 375/308 |
| 2004/0136484 A1* | 7/2004 | Joy et al. | 375/375 |
| 2005/0073902 A1 | 4/2005 | D'Luna et al. | |

OTHER PUBLICATIONS

European Search Report, dated Jan. 18, 2005, for European Patent Appl. No. 04023594.7, 3 pages.

* cited by examiner

*Primary Examiner*—Huan Hoang
(74) *Attorney, Agent, or Firm*—Sterne, Kessler, Goldstein & Fox P.L.L.C.

(57) ABSTRACT

A system and method are used to allow high speed communication between a chip and an external device. The system and method include a PLL with multiple phased outputs configured to be controlled digitally, a deskew PLL configured to align a clock of controller circuitry to interface circuitry, and a phase interpolated voltage controlled delay line configured to phase shift incoming signals. Analog design techniques of phase interpolation accurately position clocks and strobe signals that are required for high speed interfaces. The high speed interface is for transmitting and receiving signals from the external device, for example, a DDR DRAM.

12 Claims, 15 Drawing Sheets

PHASE CONTROLLED HIGH SPEED INTERFACES

CROSS REFERENCE TO RELATED APPLICATIONS

This application is a continuation of U.S. application Ser. No. 10/832,262, filed Apr. 27, 2004 (now U.S. Pat. No. 6,975,557 that issued Dec. 13, 2005), which claims benefit under 35 U.S.C. §119(e) to U.S. Prov. App. Nos.: 60/507,525, filed Oct. 2, 2003, entitled "Phase Controlled High Speed Interfaces," and 60/509,542, filed Oct. 9, 2003, entitled "Phase Controlled High Speed Interfaces," which are all incorporated by reference herein in their entireties.

BACKGROUND OF THE INVENTION

1. Field of the Invention

The present invention is related to high speed interfaces.

2. Background Art

Double Data Rate (DDR) Dynamic Random Access Memories (DRAMS) are used in many systems, such as chips in set top boxes. For a DDR DRAM to interface with a chip, clock and strobe signals should be positioned accurately within address, control, and data signals. In DDR clock cycles there are two data signals per cycle, one per half cycle. It is usually desired to strobe data when the data cycle is stable within the half cycle, for example in the middle of the half cycle. Strobing a data signal at a stable point is needed to read or write data correctly to the DDR DRAM.

Conventional systems use delay lines to produce delay in the strobe signal clock to position the strobe signal. This can be done using a multiplexer (MUX) and buffers that can generate a variable number of delays. A chain of buffers (or inverters) are used for each delay, for example, one buffer may provide 10 ps of delay, 2 buffers 20 ps, etc. The MUX has paths for one, two, three, etc. intervals of delays, so the strobe signal can be delayed by, for example, 10 ps, 20 ps, 30 ps, etc. depending on a path chosen in the MUX. Another example is a delay locked loop (DLL) design, typically a digital DLL, that uses chains of buffers in delay lines to advance locked delays, for example a quarter cycle delay may be used to delay the strobe signal.

The buffers operate as desired until data rates reach 133-150 MHz. Although the buffers give some coarseness and are not ideally controlled, they are sufficient for lower data rate implementations (e.g., below 200 MHz). However, buffer delay elements do not have ideal process, temperature, and voltage (PTV) variation controls, so their output values can vary based on these factors. Another problem is that at higher data rates (e.g., 200 MHz and above), a window for reading and writing data is smaller, for example at 200 MHz the window is 2.5 ns compared to 3.5 ns at 133 MHz. So, the accuracy of the positioning of the strobe needs to be very accurately controlled at higher data rates. However, buffers can be non-ideal at these data rates, and may not accurately position the strobe signal with respect to the data signal.

Therefore, what is needed is a system and method that can allow for strobe signal positioning at higher data rates, which also substantially reduces or eliminates strobe signal re-positioning that can be caused by variations in process, temperature, and/or voltage.

BRIEF SUMMARY OF THE INVENTION

An embodiment of the present invention provides a system including a chip coupled to an external device having write data path (or mode) including an analog device that receives a clock signal and generates strobe signals having a same or different frequency and a same or different phases, the strobe signals being used to correctly position output address, control, and data signals to an off-chip device and a chip read data path (or mode) including an analog delay device that processes input strobe signals from the off-chip device to correctly position the strobe signals, which are used to write input data into a storage device in the chip.

Another embodiment of the present invention provides analog design techniques of phase interpolation for accurately positioning clock and strobe signals that are required for high speed interfaces to communicate with external devices, for example, storage devices, DDR DRAMS, etc. The design incorporates a PLL with multiple phased outputs that can be controlled digitally, a deskew PLL for clock alignment of the controller circuitry to the interface circuitry, and a phase interpolated voltage controlled delay line for phase shifting incoming signals.

A further embodiment of the present invention provides a system including an interface configured to allow reading and writing to external devices (e.g. DDR DRAMS). The system includes a phase lock loop (PLL) (e.g., a Frac-N PLL synthesizer) configured to receive a clock signal to generate a PLL output signal and a phase interpolator device (e.g., Divider/Phase Interpolator) configured to receive a control value and the PLL output signal to generate a control clock signal. Timing of a strobe signal output from the interface is controlled using the control clock signal, such that the strobe signal occurs during a stable part of the data signal during the reading and writing.

A still further embodiment of the present invention provides using analog design techniques of phase interpolation for accurately positioning clocks and strobe signals that are required for high speed interfaces like DDR. The design incorporates a PLL with multiple phased outputs that can be controlled digitally, a deskew PLL for clock alignment of the controller circuitry to the interface circuitry, and a phase interpolated voltage controlled delay line for phase shifting incoming signals.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

Figure 1:
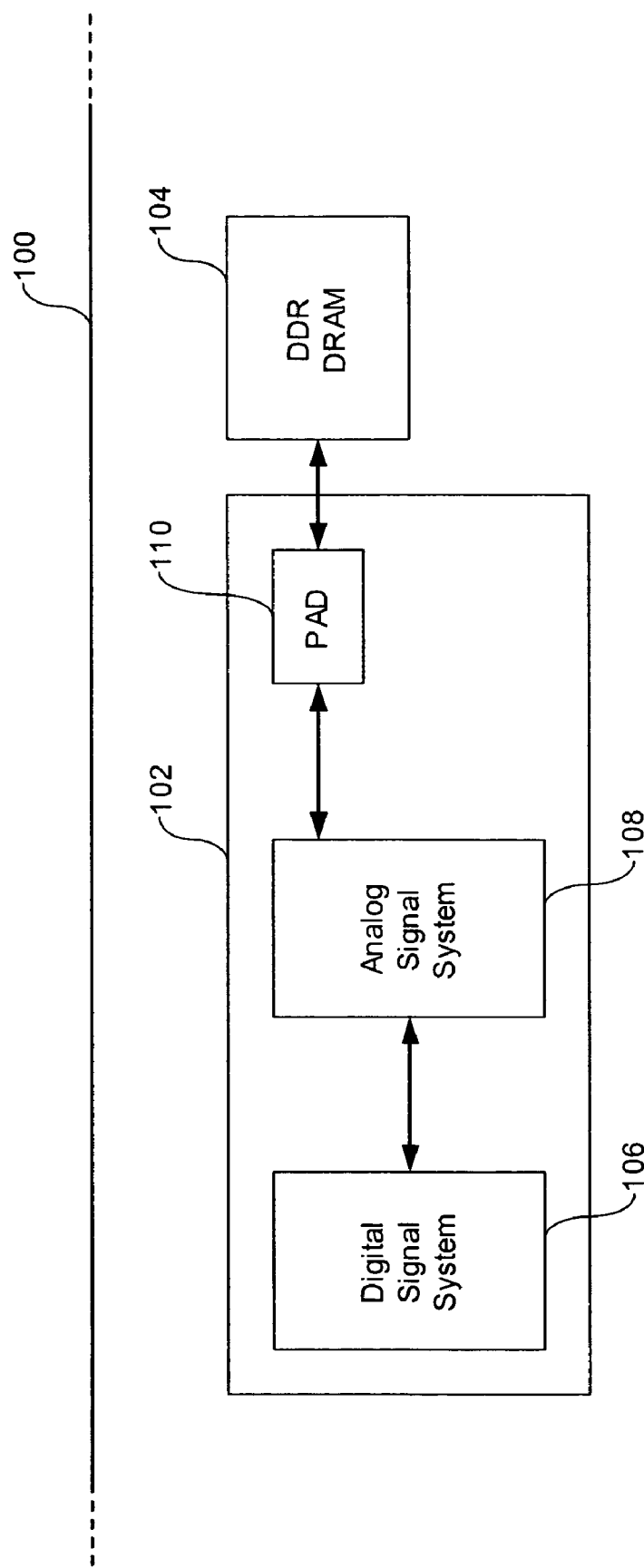
FIG. 1 shows a circuit including a chip having an analog and digital device communicating via a pad with a DDR DRAM according to an embodiment of the present invention.

The present invention will now be described with reference to the accompanying drawings. In the drawings, like reference numbers may indicate identical or functionally similar elements. Additionally, the left-most digit(s) of a reference number may identify the drawing in which the reference number first appears.

DETAILED DESCRIPTION OF THE INVENTION

Overview

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

One or more embodiments of the present invention use an analog system including a phase locked-loop (PLL) with phase interpolators to produce control clock signals to properly position a strobe signal to strobe data signals without effecting stability of the data signal. The phase interpolators can be analog devices that produce clock control signals used to delay the strobe signal for discrete time periods. In contrast to a conventional system using digital delaying of strobe signals, using analog techniques can allow for a substantial reduction in variations caused by process, temperature, and voltage (PVT), so the strobe position is more accurately controlled than a digital approach. The present invention can also be used for clock adjustment, so that clocks are positioned correctly with respect to address and control lines.

It is to be appreciated that all values discussed herein and/or shown in the figures are exemplary. Values for the various inputs, outputs, and elements can vary depending on an application or specifications of an application, as would be apparent to one of ordinary skill in the art upon reading this description. Thus, all values for inputs, outputs, and elements are contemplated within the scope of the present invention.

Overall System

FIG. 1 shows a circuit 100 including a chip 102 and an external device 104 (e.g., a storage device, a memory, a DDR DRAM, or any other device requiring a high speed interface) according to an embodiment of the present invention. Chip 102 includes a digital signal system 106 (digital section), an analog signal system 108 (analog section), and a pad 110 (e.g., one or more unidirectional and/or bidirectional pads). Pad 110 is used for signal transmission between chip 102 and DDR DRAM 104 in read and write modes. In one example, a 64 bit data signal is read from or written to DDR DRAM 104.

Figure 2:
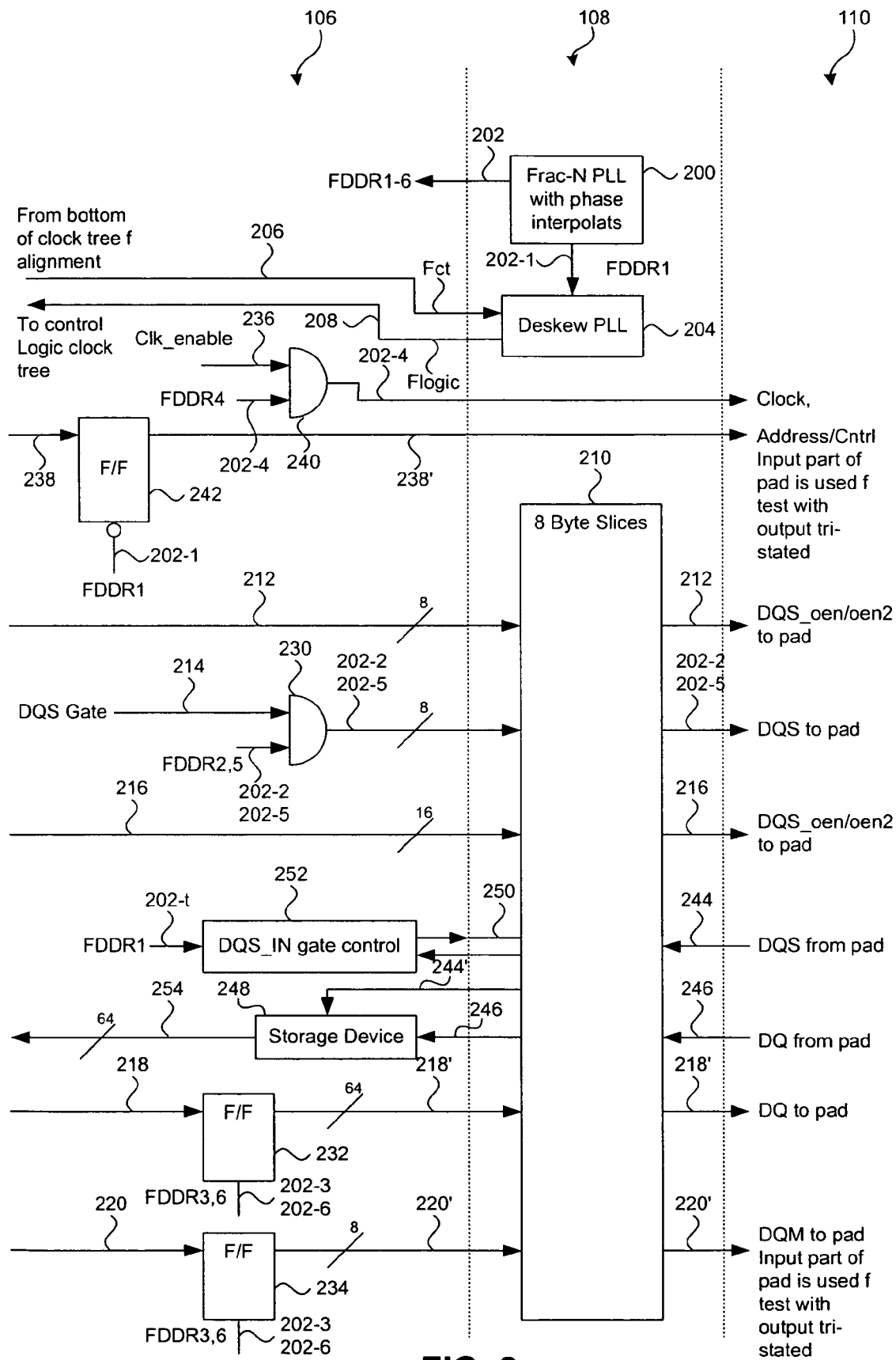
FIG. 2 is a block diagram of a high speed interface of the chip according to an embodiment of the present invention.

FIG. 2 is a block diagram of chip 102 according to an embodiment of the present invention.

A portion of digital section 106 is shown in FIG. 2 that receives signals (e.g., signals 236, 238, 212, 214, 216, 218, 220, and other signals, discussed in detail below) from another portion of digital section 106 having a memory controller or sequencer (not shown). The portion of digital section 106 not shown can also include other digital devices, which would become apparent to one of ordinary skill in the art upon reading this description.

Figure 3:
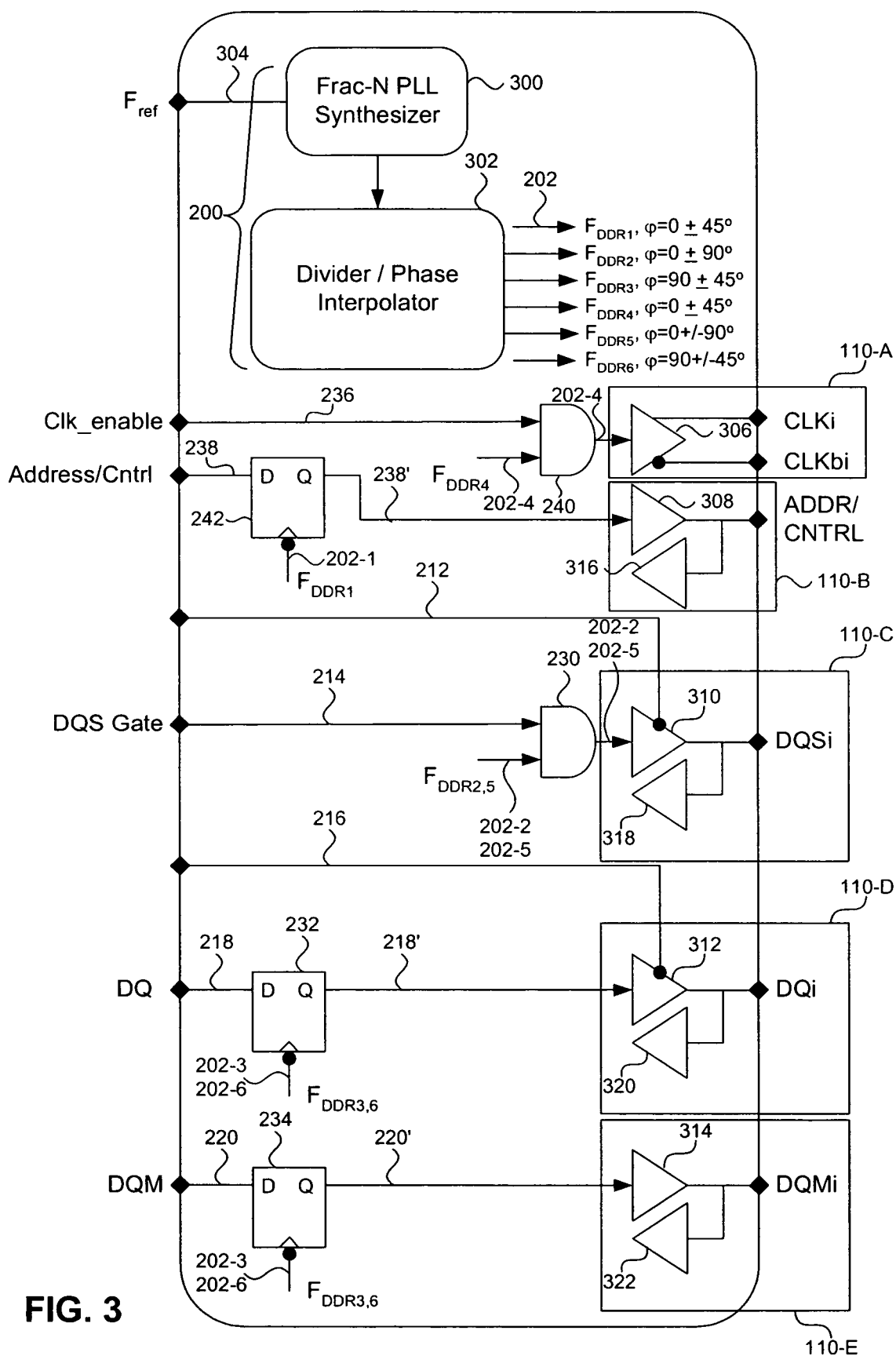
FIGS. 3 and 4 show a write data path and timing diagram, respectively, for the high speed interface in FIG. 1 according to an embodiment of the present invention.
Figure 7:
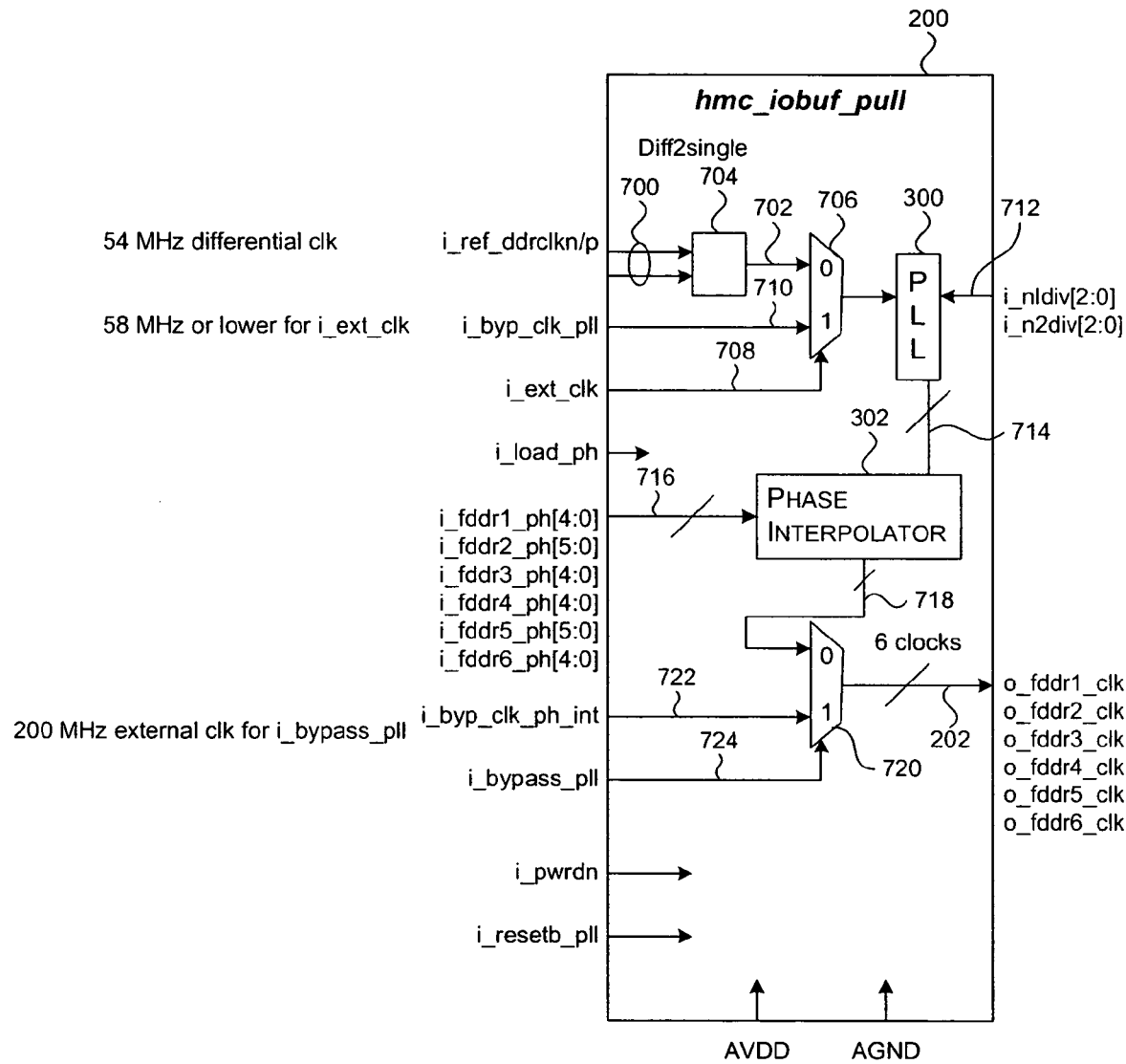
FIG. 7 is a block diagram of a PLL in FIG. 2 according to an embodiment of the present invention.
Figure 8:
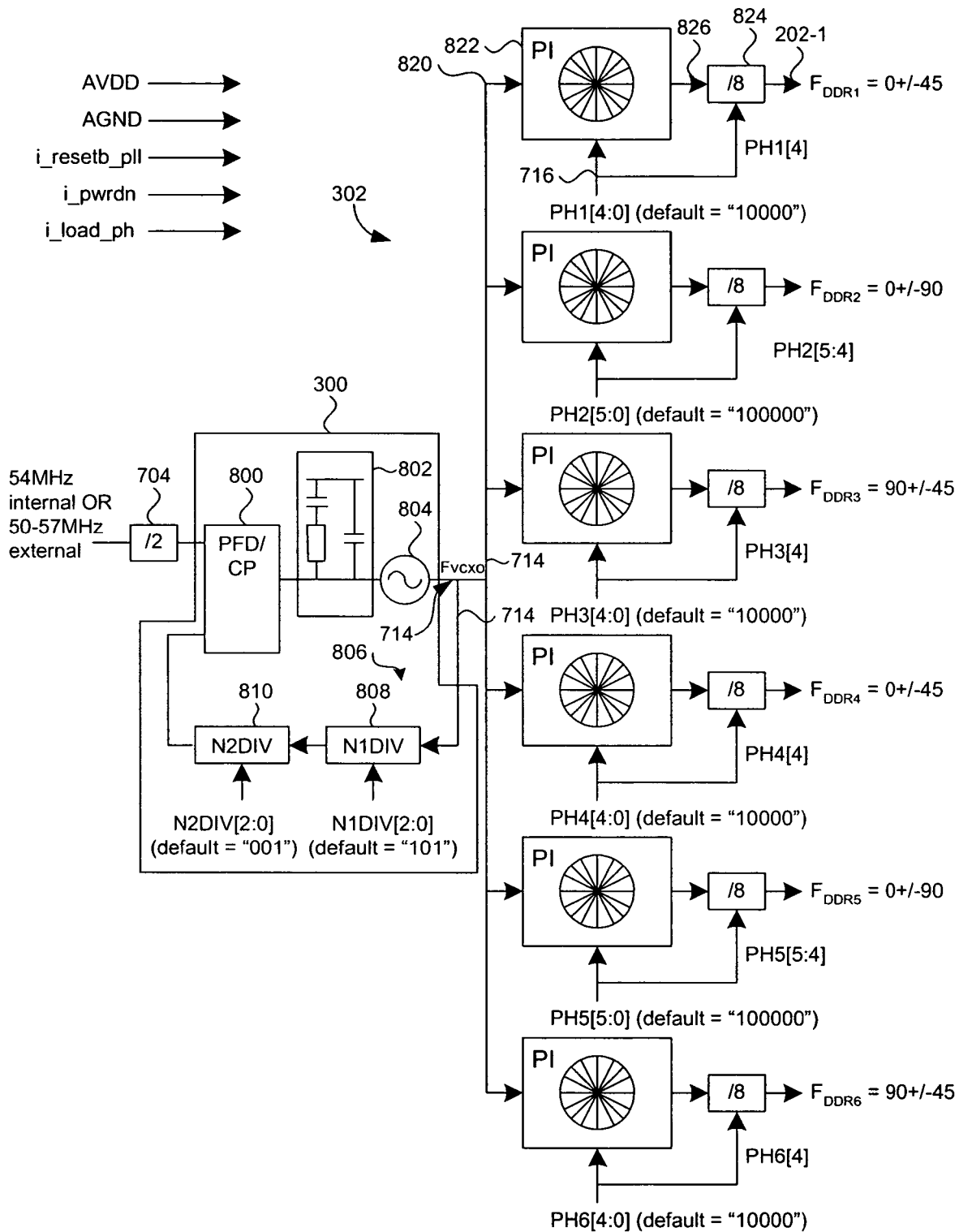
FIG. 8 is a schematic and block diagram of a PLL and phase interpolators in FIGS. 2 and 3 according to an embodiment of the present invention.

Analog section 108 includes a PLL 200 (e.g., Frac-N PLL 300 with divider/phase interpolator 302 as shown in FIGS. 3, 7 and 8) that generates clock signals FDDR1-FDDR6 202-1 to 202-6. Signals 202-2 and 202-3 can control even byte signals (e.g., 0, 2, 4, . . . ), while 202-5 and 202-6 can control odd byte signals (e.g., 1, 3, 5, . . . ) signals. PLL 200 is used to generate six clock signals FDDR1-FDDR6 202-1 to 202-6 from a single clock signal Fref 304 (FIG. 3). The six clock signals FDDR1-FDDR6 202-1 to 202-6 all have a same frequency, which may be a multiple of Fref 304, but are phase-adjusted with respect to each other, as shown in FIGS. 3 and 8. The phase adjustment amounts are based on control signals determined during testing and/or monitoring of reading and writing of data to and from DDR DRAM 104 as the data is varied.

Figure 9:
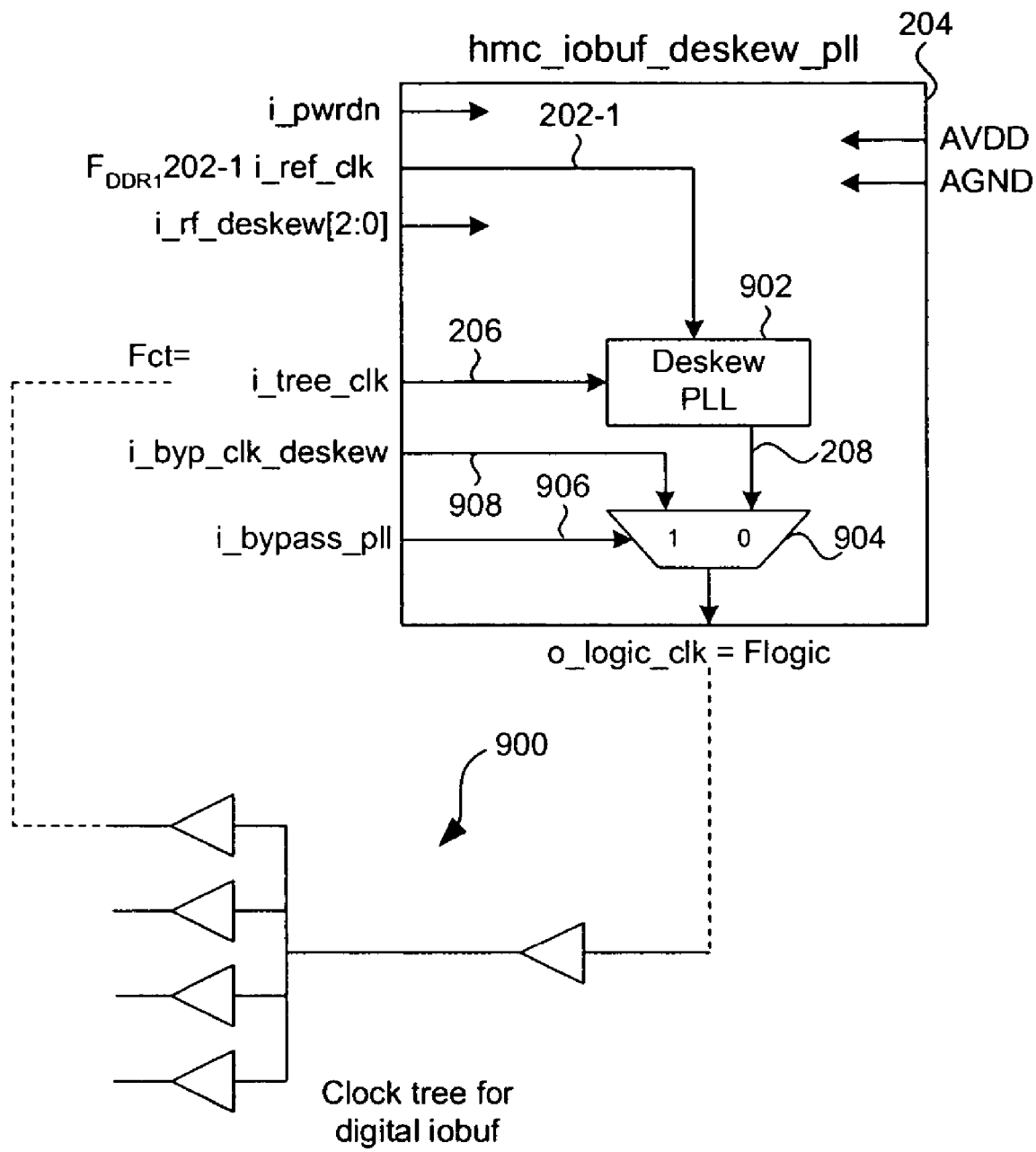
FIG. 9 show ports of a deskew PLL in FIG. 2 according to an embodiment of the present invention.
Figure 10:
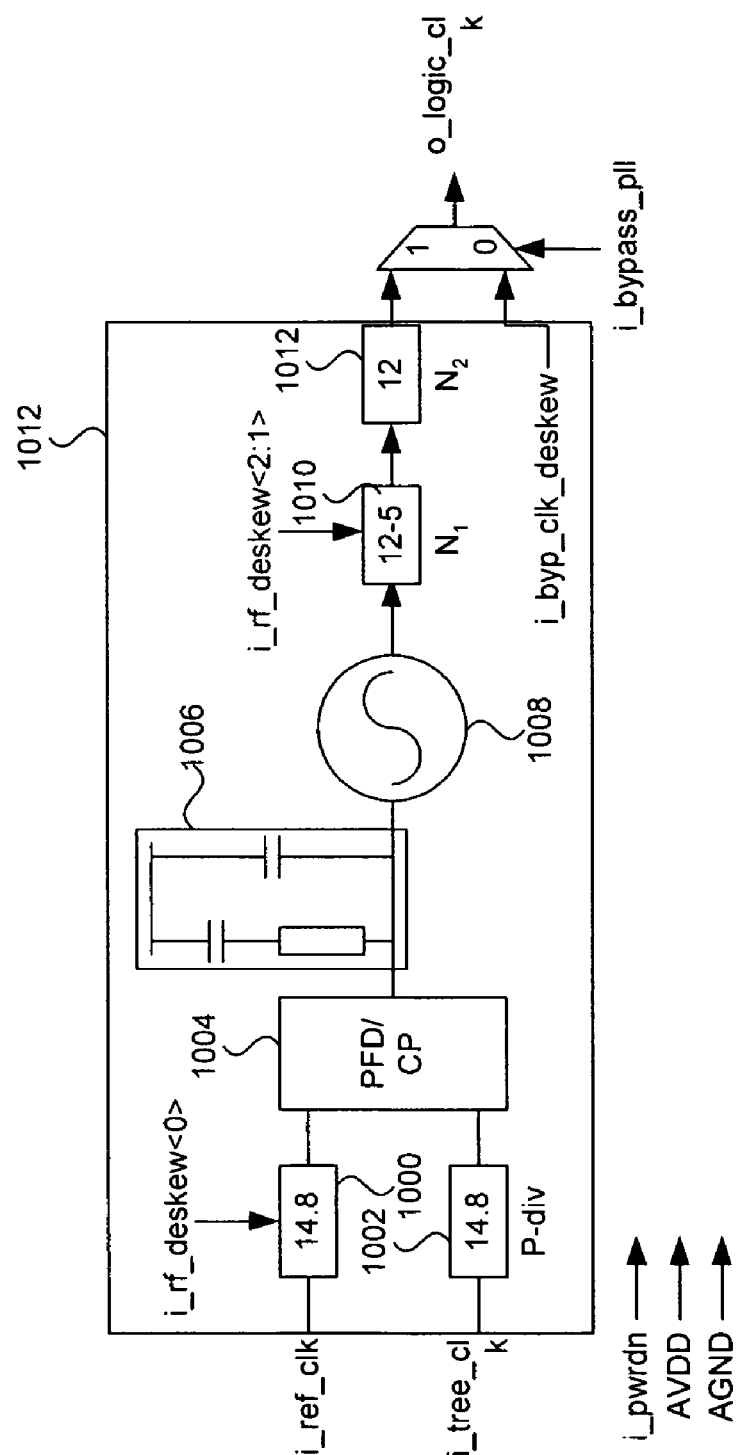
FIG. 10 is a schematic and block diagram of the deskew PLL in FIGS. 2 and 9 according to an embodiment of the present invention.

Analog section 108 also includes a deskew PLL 204 that aligns a clock of control circuitry with a clock of interface circuitry (see also FIGS. 9-10). Signal FDDR1 202-1 is used as a reference signal that is input to deskew PLL 204. Deskew PLL 204 also receives a clock signal Fct 206 from a clock tree 900 (FIG. 9) that is within chip 102. Deskew PLL 204 generates an output clock signal Flogic 208. Deskew PLL 204 aligns signal Fct 206 to signal FDDR1 202-1 through a determination of the delay imposed on signal Flogic 208 by clock tree 900 (FIG. 9). Thus, signal Flogic 208 is an adjusted signal that takes into account delay caused by clock tree 900. Signal Flogic 208 is received at a top portion of the clock tree 900.

Figure 11:
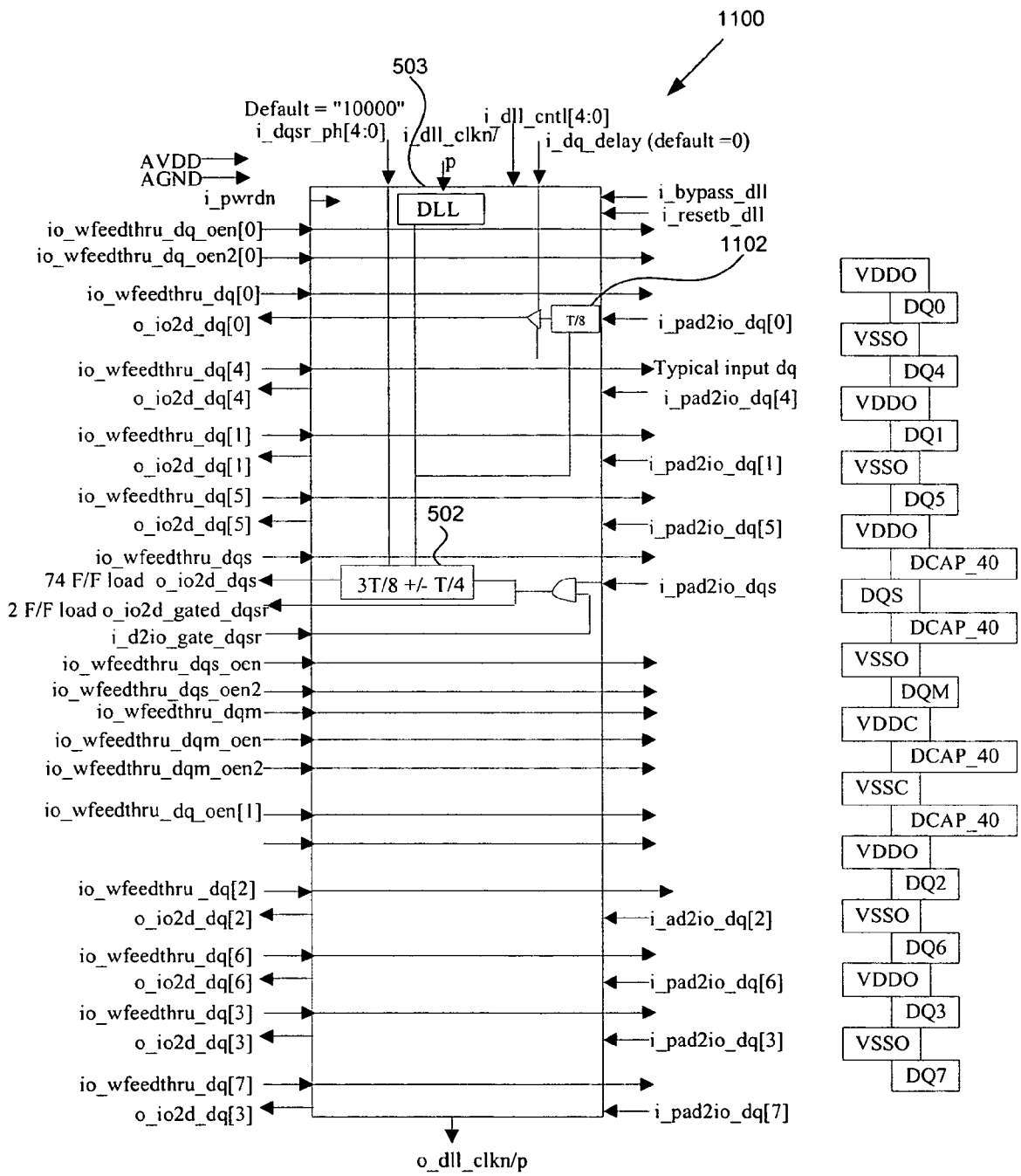
FIG. 11 shows details of one of eight byte slices in FIG. 2 according to an embodiment of the present invention.
Figure 12:
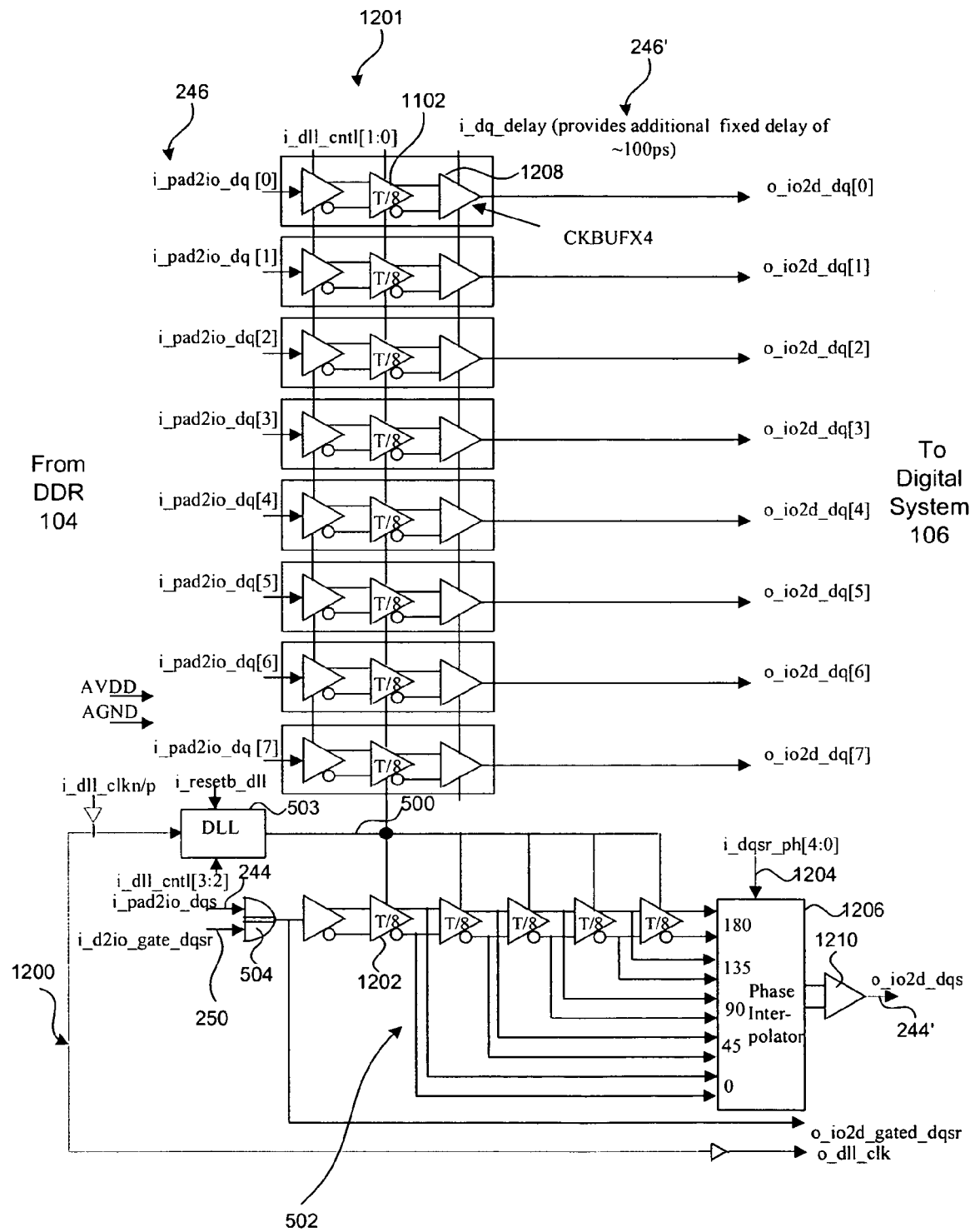
FIG. 12 shows delay paths in a read data path according to an embodiment of the present invention.

Analog section 108 further includes an eight byte slice device 210. Details of one portion (one byte) 1100 (FIG. 11) of eight byte slice device 210 are shown in FIGS. 11-12 and discussed in relation thereto.

The present invention is applicable to, among other things, DDR memory interfaces, such as on a BCM7038 chip manufactured by Broadcom, Inc. of California. This type of interface can require precise control of clocks and strobing signals. As the speed of the interface increases, the accuracy of positioning the necessary strobe and clock signals with respect to the data signals becomes more stringent.

Write Data Path Configuration

Figure 4:
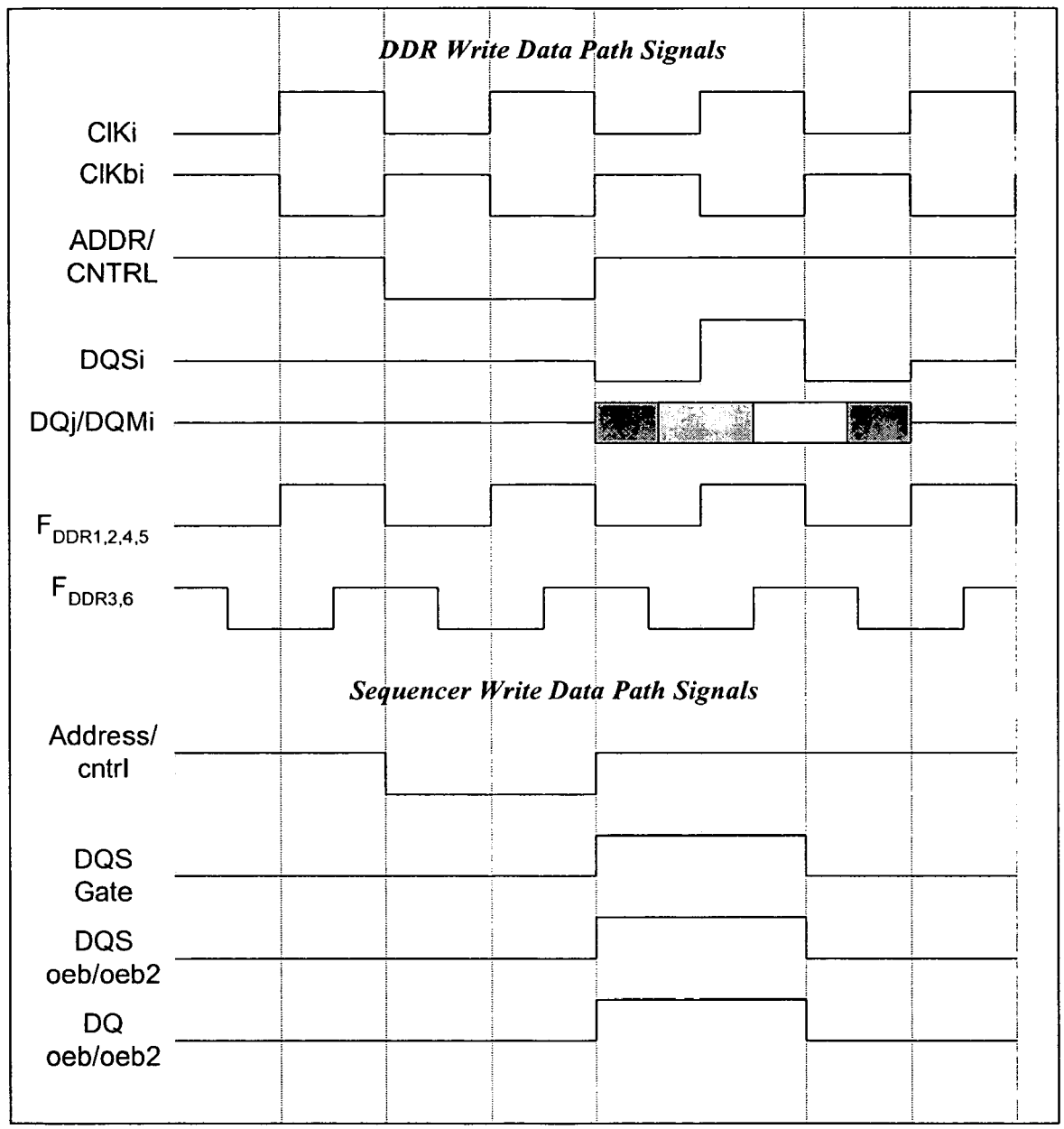

Reference is now made to FIGS. 3 and 4, with continuing reference to FIG. 2. FIGS. 3 and 4 show a write data path and timing diagram, respectively, in analog device 108 according to an embodiment of the present invention. FIG. 3 also shows a plurality of pads 110-A to 110-E. In this embodiment, pad 110-A is unidirectional, while pads 110-B to 110-E are all bidirectional pads. Unidirectional pad 110-A includes a driver 306 and two pins CLKi and CLKbi. Bidirectional pads 110-B to 110-E all include drivers (drivers 308-314, respectively), receivers (receivers 316-322, respectively), and pins (pins ADDR/CNTRL, DQSi, DQi, and DQMi, respectively).

Clock enable signal 236 determines when gate 240 will pass signal 202-4 to driver 306 and out pin CLKi and CLKbi. In this embodiment, only when clock enable signal 236 is HIGH can signal 202-4 pass through gate 240.

Signal 202-1 controls when address and control signal 238 can be transmitted to pad 110-B. Address and control signal 238 is latched and delayed in flip-flop 242 until signal 202-1 releases signal 238' from flip-flop 242.

DQS enable signal 212 (strobe enable) controls enabling of driver 310, which controls when signal 202-2 (even bytes) or 202-5 (odd bytes) will be output to pins DQSi. DQS gate signal 214 (strobe window opening) controls when DQSi signals 202-2/5 pass through gate 230 to be output through pin DQSi. Signals 202-2/5 can only pass through gate 230 when gate signal 214 is HIGH.

Signals 202-3 (even bytes) or 202-6 (odd bytes) control when data signal DQ 218 can be transmitted to pad 110-D. Data signal 218 is latched and delayed in flip-flop 232 until one of signals 202-3 or 202-6 release signal 218' from flip-flop 232. As discussed above, signal 202-3 controls even bytes, while signal 202-6 controls odd bytes. DQ enable signals 216 (data enable) controls enabling of driver 312, which controls when data signal DQj 218' can be output from pad 110-D.

Signals 202-3/6 also control when data mask signal DQM 220 can be transmitted to pad 110-E. Data mask signal 220 is latched and delayed in flip-flop 234 until one of signals 202-3 or 202-6 releases signal 220' from flip-flop 234. Data mask signal 220/220' is used to mask data during writing and/or reading, when desired, for example during invalid bursts.

As discussed above, during write mode, CLK_enable signal 236 (clock) and address and control signal 238 are output to pad 110. Clock signal 236 is controlled by FDDR4 202-4 via AND gate 240 and address and control signal 238 is controlled by FDDR1 202-1 via flip-flop 242.

Read Data Path Configuration

Figure 5:
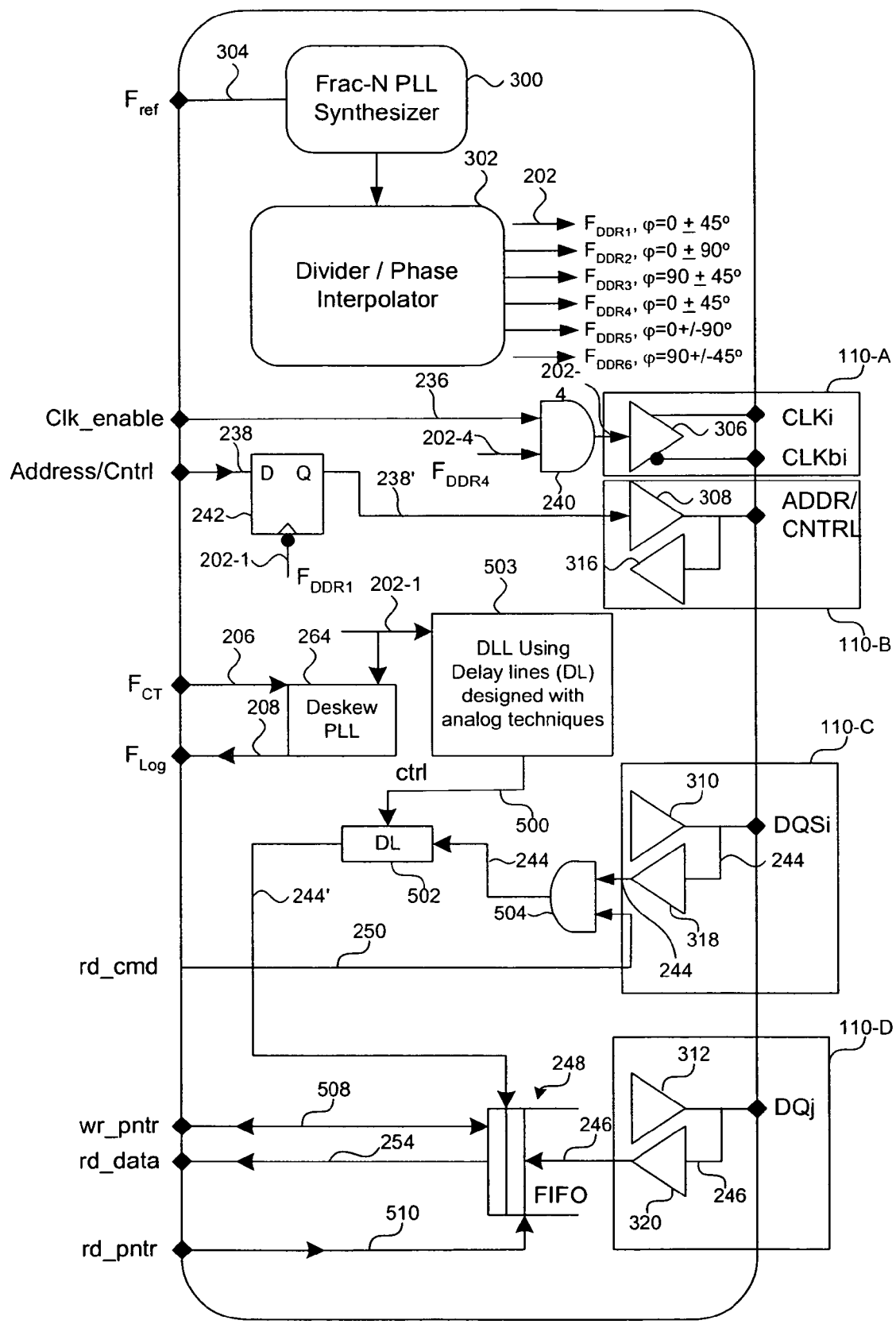
FIGS. 5 and 6 show a read data path and timing diagram, respectively, for the high speed interface in FIG. 1 according to an embodiment of the present invention.
Figure 6:
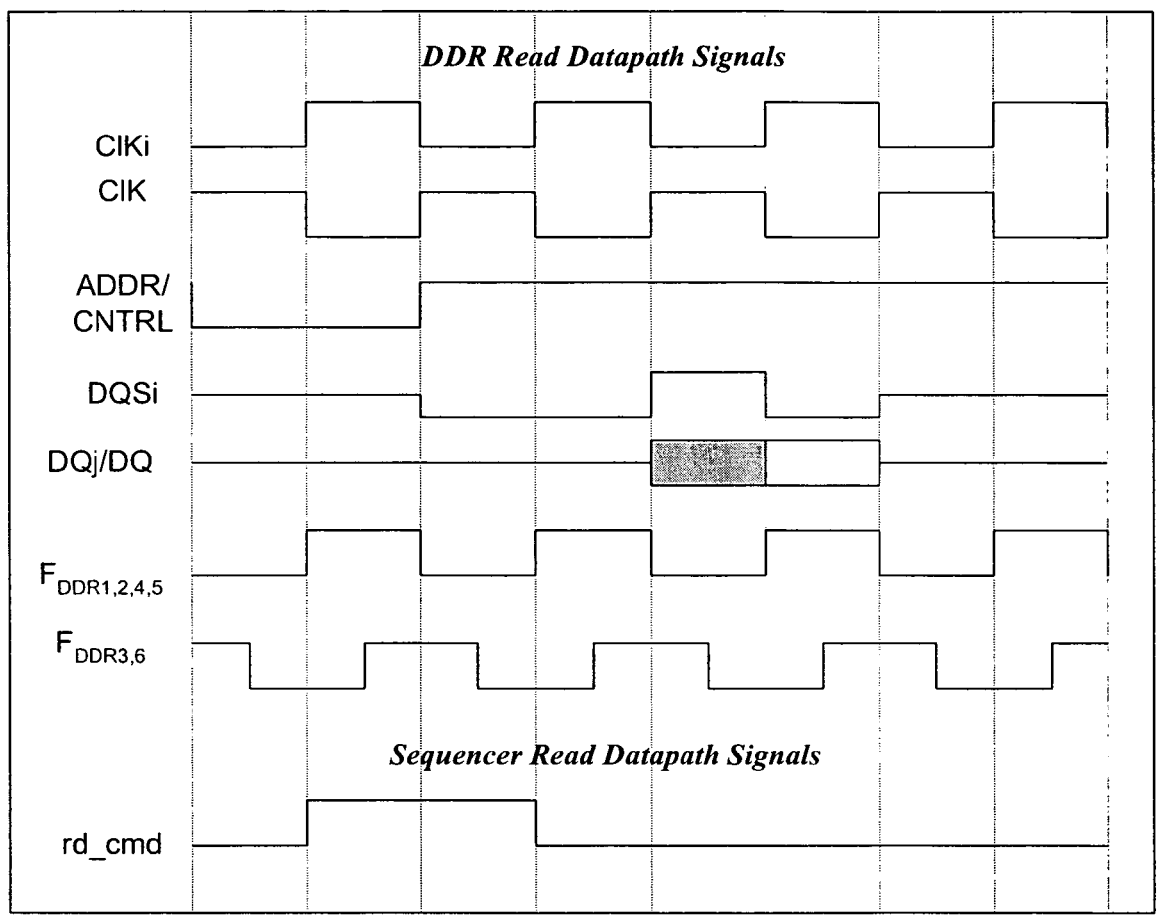

Reference is now made to FIGS. 5 and 6, with continuing reference to FIG. 2. FIGS. 5 and 6 show a read data path and timing diagram, respectively, for analog device 108 according to an embodiment of the present invention. In FIG. 5, drivers 306-312, respectively, are disabled so pads 110-C and 110-D all receive signals and forward those received signals. More details of one embodiment of the read data path are shown in FIGS. 11-12, and described in relation thereto.

Also in FIG. 5, a strobe signal 244 from DDR DRAM 104 is received at pad 110-C, which is forward via receiver 318. A gate 504 controls transmission of signal 244 using a read control signal 250 (e.g., rd_cmd) transmitted from gate control 252. Signal 244 is only transmitted through gate 504 when read control signal 250 is HIGH. Once transmitted, signal 244 is delayed using delay line DL 502 to form delayed signal 244'. Delay line 502 receives a control signal 500 from a delay locked loop (DLL) 503.

A data signal 246 is received at pad 110-D and forward via receiver 320. Delayed signal 244' and a write pointer signal 508 are used to strobe and write a strobed data signal 246 into a storage 248 (e.g., a first-in-first-out (FIFO) memory). A read pointer signal 510 is used to control reading from storage 248, e.g., read pointer signal 510 can be used to access data 254 stored in a desired section of storage 248.

Phase Locked Loop and Phase Interpolator

FIG. 7 is a block diagram of PLL 200 according to an embodiment of the present invention. In this embodiment, a differential digital clock signal 700 (e.g., i_ref_ddrclk n/p, such as a 54 MHz differential clock signal) is converted into a single ended clock signal 702 in device 704 (e.g., a Diff2single device). In normal operation, multiplexer 706 receives a control signal 708 to control which path (0 or 1) passes a signal. For example, in normal operation path 0 can pass signal 702 to PLL 300, while in testing/bypass operation path 1 can pass testing/bypass signal 710 (e.g., i_byp_clk_pll, such as a 58 MHz or lower clock signal) to PLL 300.

PLL 300 receives signal 702 or signal 710 and a input signal 712 (e.g., based on i_n1div and i_n2div (see also FIG. 8)). PLL 300 outputs clock signals 714 (e.g., Fvcxo in FIG. 8), which can be multiples of signals 702 or 710, to phase interpolator 302. In one embodiment, there can be eight signals 714 that have the same frequencies and different phases. Phase interpolator 302 also receives phase control signals 716-1 to 716-6 (e.g., i_fddm_ph, where n=1 to 6). Phase interpolator 302 uses these input signals 714 and 716 to generate six output clock signals 718-1 to 718-6 (e.g., o_fddrn_clk). The clock signals 718-1 to 718-6 have a same frequency, but are phase shifted with respect to each other. A multiplexer 720 can be used to allow clock signals 718 along path 0 during normal operations or testing/bypass signal 722 (e.g., i_byp_clk_ph_int, such as a 200 MHz external clock signal) along path 1 during testing/bypass operation. Multiplexer 720 receives a signal 724 (e.g., i_bypass_pll) at its control port to control which path (0 or 1) passes an input signal (718 or 722).

In one example, the signals being received or transmitted through respective ports in FIG. 7 can have the following characteristics:

o_fddr1_clk=0 deg+/−45 deg (for Addr/ctrl)

o_fddr2_clk=0 deg+/−90 deg (for Write DQS even bytes for byte staggering)

o_fddr3_clk=90 deg+/−45 deg (for Write DQ even bytes for byte staggering)

o_fddr4_clk=0 deg+/−45 deg (for clock)

o_fddr5_clk=0 deg+/−90 deg (for Write DQS odd bytes for byte staggering)

o_fddr6_clk=90 deg+/−45 deg (for Write DQ odd bytes for byte staggering)

FIG. 8 is a schematic and block diagram of PLL 300 and phase interpolator 302 according to an embodiment of the present invention. PLL 300 includes phase-frequency detector/charge pump 800 (PFD/CP), a loop filter 802, a voltage controlled oscillator 804, and a feedback loop 806 that includes first and second dividers 808 and 810.

Phase interpolator 302 includes six branches 820 each having a phase interpolator 822 and a divider 824. Each phase interpolator 822 selects two phases of clock signals 714 under control of control signal 716 and produces an adjusted or moved phase of clock signals 826, which is a weighted average of the two phases of the two clock signals 714 based on control signal 716 (e.g., PHn), discussed in more detail below with respect to FIG. 15. A phase-shifted signal 826 is divided in divider 824 (e.g., an 8 way divider) and output as FDDR 202. Using phase interpolators 822, clock signals 714 are given a base line phase shift of either 0 or 90 degrees and then fine tuned to +/−45 degrees or +/−90 degrees, depending on where the FDDR signal is being transmitted to (see FIGS. 2, 3, and 5). In one embodiment, the default phase control values produce 0 degrees for signals FDDR1,2,4,5 and 90 degrees for signals FDDR3,6.

In one embodiment, the resolution for the phase controls is 2.8125 degrees, 5-bit controls can vary the phase +/−45 degrees, and 6-bit controls can vary the phase +/−90 degrees. For the 5-bit controls, the default reset value is "10000" and for the 6-bit controls the default reset value is "100000".

Deskew Phase Locked Loop

FIG. 9 show ports of deskew PLL 204. As described above, deskew PLL 204 receives FDDR1 202-1 (e.g., i_ref_clk) as a reference signal at deskew PLL 902 to align Fct 206 (e.g., i_tree_clk). A multiplexer 904 can be used to allow for testing/bypass mode, which is controlled at its control terminal using signal 906 (e.g., i_bypass_pll). When in normal mode, channel 0 routes signal 208 to clock tree 900, however when in test/bypass mode, channel 1 passes signal 908 (e.g., i_byp_clk_deskew) to clock tree 900.

FIG. 10 is a schematic and block diagram of deskew PLL 204 according to an embodiment of the present invention. Deskew PLL 204 includes dividers 1000 and 1002, phase-frequency detector/charge pump 1004, loop filter 1006, voltage controlled oscillator 1008, and dividers 1010 and 1012.

Byte Slice System

FIG. 11 shows details of one of eight byte slices 1100, which are arranged to make up eight byte slice device 210 in FIG. 2. Each byte slice 1100 receives 8 sets of signals or bits. In write mode, several of these bits feed through byte slice 1100 without being processed. In read mode, bits are passed through delay devices 502 and 1201 (shown only in FIG. 12). The boxes on the far right side of the figure are portions of pad 110 being used to transmit and receive signals between chip 102 and DDR DRAM 104.

Byte Slice Read Analog System

FIG. 12, in which a read data flow is shown in a reverse direction to the other figures, is a schematic diagram of a read data path including a strobe signal phase control system 1200 according to an embodiment of the present invention. In this embodiment, data 246 is received from DDR DRAM 104 (FIG. 1) via the left side and transmitted to digital system 106 (FIG. 1) via the right side, or opposite all other figures. Data signals 246 (e.g., i_pad2io_dq)) are delayed using delay devices 1201 (e.g., one or more buffers 1208 and T/8 delay devices (voltage control delay lines (VCDLs) 1102) delaying by T/8, T being the clock period).

In strobe signal phase control system 1200, strobe signals 244 (e.g., i_pad2io_dqs) are transmitted based on gate signal 250 (e.g., i_d2io_gate_dqsr) at AND gate 504 before reaching delay line 502. Signals 244 can be delayed by an adjustable amount from 0-180 degrees, with 90 degrees being the nominal value using multiple T/8 delay devices 1202 that are delay locked (e.g., have a fixed delay). The control for the adjustment is a signal 1204 (e.g., i_dqsr_ph, possibly a digital signal). The variation in phase delay is achieved with an analog phase interpolator 1206. The phase adjusted signal 244' (e.g., o_io2d_dqs) is used to strobe data 246 into storage 248 (FIGS. 2 and 5). The T/8 plus selectable fixed delay device 1208 in the data signal path permits strobe signal 244' to be swept beyond the beginning and end of the stable data half cycle time, which allows a sweep calibration procedure to accurately position strobe 244' at an optimal point in the data value/window for strobing into storage 248. The sweep calibration involves writing and reading from DDR 104 till failure is observed at extremes of the sweep.

In one embodiment, DLL 503 generates a voltage reference input 500 to lock all T/8 delays 1202. A final delay value can be used for phase interpolation using phase interpolator 1206. This allows system 100 (FIG. 1) to adjust strobe 244 at the stable data point when reading data back. System 100 positions strobe signal 244 to produce an output signal 244' (e.g., o_io2d_dqs) from driver 1210, which is used inside chip 102 to strobe data 246. So, an input strobe signal 244 is received and is delayed by some amount before reaching phase interpolator 1206. Then strobe signal 244' is used to actually latch the data 246 when reading from other chips 104.

Bypass Clock Systems for Analog Testing

Figure 13:
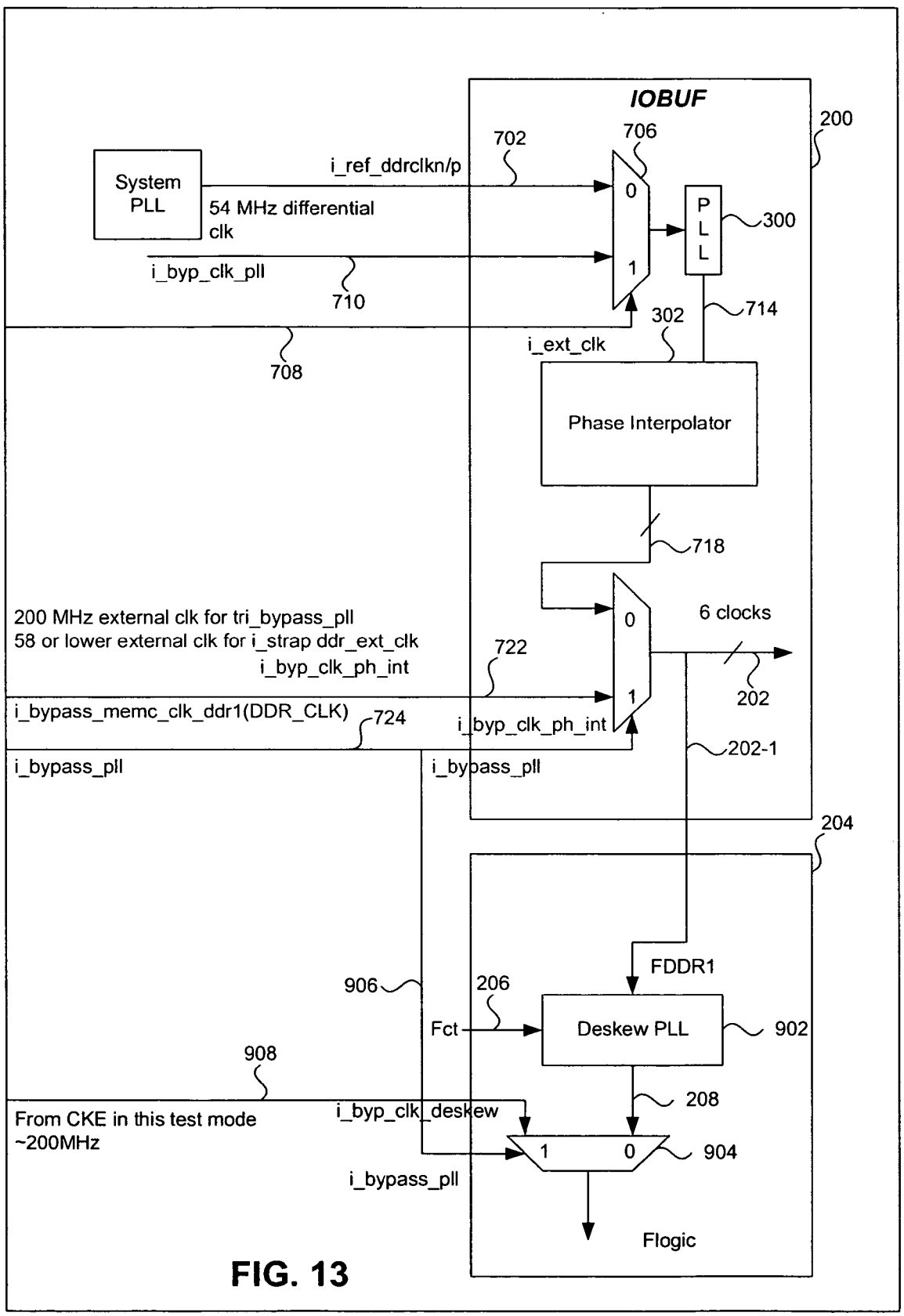
FIG. 13 shows a combined schematic and block diagram of FIGS. 7 and 9 where two clocks are used for two test clock signals according to an embodiment of the present invention.

FIG. 13 shows a combined schematic and block diagram of FIGS. 7 and 9 where clock signals 710 and 908 are used for two test clock signals according to an embodiment of the present invention.

Figure 14:
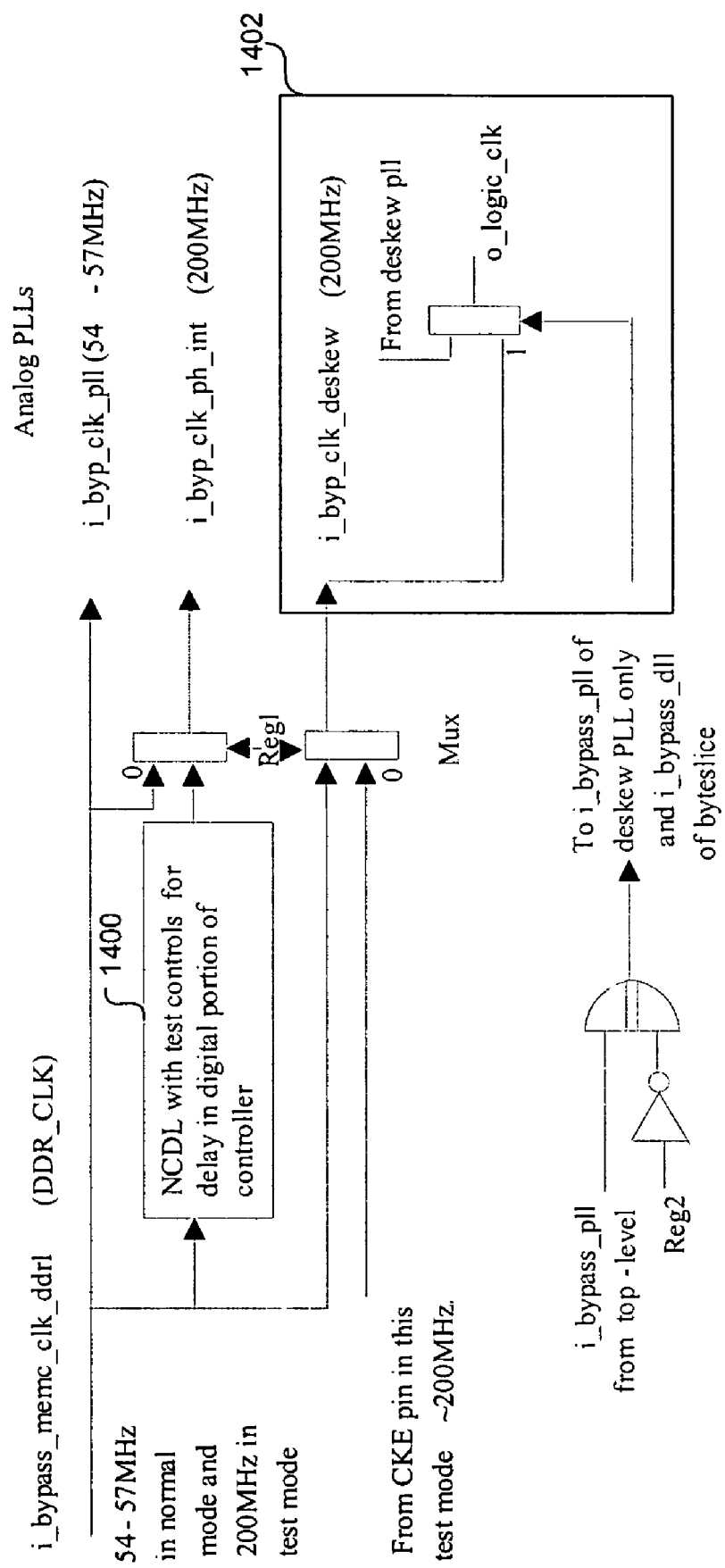
FIG. 14 is a portion of FIG. 13 with only one clock according to an embodiment of the present invention.

FIG. 14 is a portion of FIG. 13, with additional circuitry compared to FIG. 13 according to an embodiment of the present invention. In this embodiment, either two test clocks can be used or only one clock that is adjusted with device 1400, which is a numerically controlled delay line of the buffer type that may only be used for test purposes. Section 1402 is in analog deskew p11 and connected as shown.

There can be three possible modes for the scheme shown in FIG. 14. A first mode is where two clocks are used that are received at pins DDR_CLK and CKE (default mode). A second mode is where the numerically controlled delay line (NCDL) is used with a single clock that is received at pin DDR_CLK. A third mode is where one clock is used that is received at pin DDR_CLK and deskew pll 902 is working normally.

Phase Interpolator

Figure 15:
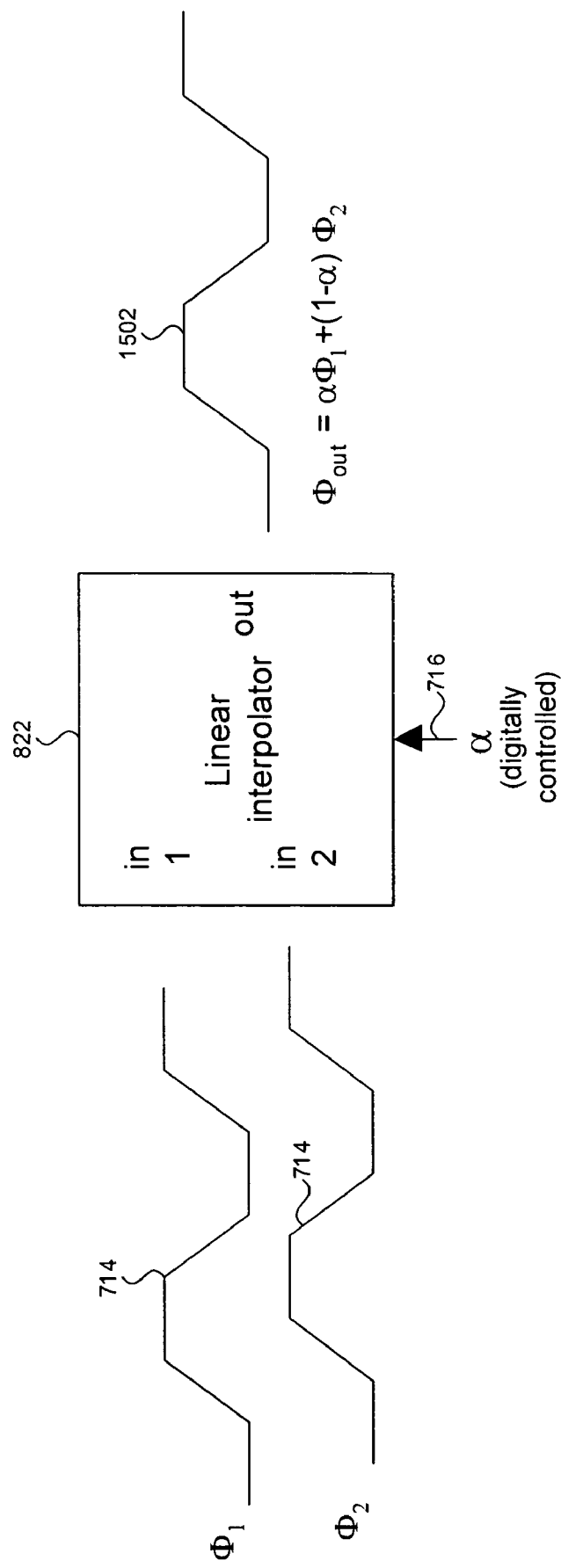
FIG. 15 shows a phase interpolator of FIG. 8 according to an embodiment of the present invention.

FIG. 15 shows the phase interpolator 822 of FIG. 8 according to one embodiment of the present invention. The phase interpolator 822 performs a weighted sum of the two input clock signals 714 $\Phi_1$ and 714 $\Phi_2$, which are shifted in phase with respect to each other by less than 45 degrees. A weighting factor 716 $\alpha$ is digitally controlled. The resulting output clock 1502 $\Phi_{out}$ has a phase, which is the weighted mean of the input clock phases.

Exemplary Operation

Thus, in an embodiment of the present invention, an analog module 108 provides general clock synthesis usable in WRITE mode timing control and READ mode timing control for the DDR I/O interface. Clock synthesizer PLL 200 receives, for example, a 54 MHz differential reference clock 700 and produces six independent DDR output clocks FDDR1-6 202-1 to 202-6 with programmable frequency ranges from 100 MHz to 202 MHz. All six output clocks FDDR1-6 202-1 to 202-6 have digital phase control using 5 or 6 bit inputs.

Clock synthesizer PLL 200 outputs are received at zero insertion (deskew) PLL 204, DLL 503, read path DQS phase control system 1200, and additional digital logic circuits for write DQS, DQ, and DQM. The zero insertion deskew PLL 204 output Flogic 208 is advanced from the feedback return input Fct 206 to compensate for delay path 900 in the memory controller or sequencer of digital logic section 106 that supplies at least signals 236, 238, 212, 214, 216, 218, and 220. The DLL 503 provides master timing control for digital programmable delay line 502 in strobe signal phase control system 1200. Each DQS phase control section adjusts the phase of the DQS_IN Rx strobe 244 with respect to a byte of incoming DQ data (DQI<7:0>, i=0, . . . ,7) 246. The delayed DQS_OUT 244' signal clocks the data 246 into memory 248, which outputs a 8-bit data word. The complete 64-bit DDR DQ word uses 8 strobes in the 8 byte slices 1100. DLL 503 is included with each of the 8 phase control systems 1202. These systems 1202 are analog for better PVT control as DDR speeds get to 200 MHz and beyond.

FIGS. 7 and 8 show the PLL 300 that supplies 6 clock signals FDDR 202-1 to 202-6, each of which can be phase adjusted independently using the phase interpolators 822, as discussed above.

As seen in FIGS. 3, 5, and 8, clock positioning using phase interpolation can be done independently from most if not all of the digital circuitry being used because system 200 produces multiple outputs 202 from a single PLL 300. For example, a first output 202-1 can be used to clock internal devices of a chip 102 phasing the address and control clock (FIG. 5), and a second output 202-4 can be independently positioned and transmitted to pad 110 to be transmitted outside chip 102. Thus, system 200 of the present invention can allow for independent control of external and internal clocks, strobes, and data.

In FIG. 8, six phase interpolators 822 receive a common input signal 714 from PLL 300. The outputs 202 of the phase interpolators 822 can be FDDR1=0+/−45 (+/− is the control), FDDR2=0+/−90, FDDR3=90+/−45, etc. Phase adjustments for phase interpolator output signals 202 can be set up independently from one PLL 300.

For example, FDDR4 202-4 can be transmitted outside chip 102 producing it, and FDDR1 202-1 can be used inside chip 102. If FDDRI 202-1 is used inside chip 102, phase from chip 102 can be a certain value for address and control signals.

Using the system 100 of the present invention, a user can independently, for each particular design, tune FDDRI 202-1 to adjust it to be optimal for the address and control lines coming out of chip 102. This can be done while also taking into account the value of FDDR2 202-2 that was used internally in chip 102. The independent control of FDDR values 202 using the phase interpolators 822 allows independent tuning of internal and external strobe clock signals DQSi. Also, using phase interpolators 822 instead of digital delay lines allows for more accurately positioning of strobe, address, and control signals by substantially eliminating variations caused by process, temperature, and voltage.

For the strobe signals, phase interpolators 822 can be used that allow delay of the strobe signal by 90 degrees +/− some desired amount. The strobe signal can be bi-directional signal. When writing to a DDR device 104 outside chip 102 on which the strobe is generated, the strobe needs to be positioned around 90 degrees from the start of the data, or at any good stable point. This can be accomplished using the phase interpolators 822 that produce independent clock controls 202 associated with the strobe signal DQSi transmitted external to the chip 102.

When a strobe signal is received from a DDR device 104 external to the chip 102, the sending chip 104 supplies the strobe signal. The received strobe signal is aligned with received data, which means that when data changes the strobe changes. So, the system 100 internally shifts the strobe signal to an appropriate stable data point before strobing the data. Otherwise, the receiving chip might strobe the data while the data is changing. Chip 102 does this using voltage controlled delay lines.

Timing Models

By designing the final driver from the analog blocks to be a characterized standard cell, timing models that are compatible with layout extraction and a static timing analysis tool are obtained. This allows timing closure using a digital approach with analog modules. A phase interpolated design that allows accurate phase control to be tuned in the system avoids iterations in the overall timing closure.

Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A phase interpolator system, comprising:
    a plurality of branches, each branch comprising
        a phase interpolator that receives a clock signal and a control signal, which are distinct from one another, and that generates a phase shifted clock signal through phase shifting the received clock signal during a phase shifting operation, and
        a divider that divides the phase shifted clock signal to produce an output clock signal.

2. The phase interpolator system of claim 1, wherein during the phase shifting operation each of the phase interpolators performs:
    a coarse shifting operation that establishes a base line phase shift value for the received clock signal, producing a coarsely phase shifted clock signal; and
    a fine tuning shifting operation that shifts the coarsely phase shifted clock signal with respect to the established base line phase shift value, producing a finely phase shifted clock signal.

3. The phase interpolator system of claim 2, wherein the base line phase shift value is about 0 degrees or about 90 degrees.

4. The phase interpolator system of claim 2, wherein during the fine tuning shifting operation, an incremental phase shift between about +/−45 degrees or between about +/−90 degrees is performed with respect to the base line phase shift value.

5. The phase interpolator system of claim 4, wherein a resolution of the incremental phase shift is based on a bit size of the control signal.

6. The phase interpolator system of claim 1, wherein the divided phase shifted clock signal output from each of the plurality of branches has a same frequency.

7. The phase interpolator system of claim 1, wherein during the phase shifting operation each of the phase interpolators:

selects a pair of the clock signals using the control signal, and generates a weighted average for the phases of the pair of clock signals based on the control signal.

8. A method for producing a phase shifted output clock signal, comprising:
 (a) coarsely phase shifting a phase of a received clock signal to establish a base line phase shift value based on a received phase control signal, which is distinct from the received clock signal; and
 (b) incrementally phase shifting the coarsely shifted clock signal higher and lower than the established base line phase shift value.

9. The method of claim 8, wherein the base line phase shift value is about 0 degrees or about 90 degrees.

10. The method of claim 8, wherein step (b) comprises performing the incremental phase shifting between about +/−45 degrees or between about +/−90 degrees with respect to the base line phase shift value.

11. The method of claim 8, wherein during step (b) a resolution of the incremental phase shift is based on a bit size of the phase control signal.

12. A phase interpolator system, comprising:
a plurality of branches, each branch comprising
 a phase interpolator configured to:
  receive a clock signal and a control signal, which are distinct from one another, and
 generate a finely phase shifted clock signal through phase shifting the received clock signal during a phase shifting operation, the phase shifting operation comprising,
  a coarse shifting operation that establishes a base line phase shift value for the received clock signal, producing a coarsely phase shifted clock signal, and
  a fine tuning shifting operation that shifts the coarsely phase shifted clock signal with respect to the established base line phase shift value, producing the finely phase shifted clock signal; and
 a divider that divides the finely phase shifted clock signal to produce an output clock signal.

* * * * *